(12) United States Patent
Takahashi et al.

(10) Patent No.: US 7,534,292 B2
(45) Date of Patent: May 19, 2009

(54) FILM-FORMING COMPOSITION, INSULATING FILM OBTAINED FROM THE COMPOSITION AND ELECTRONIC DEVICE HAVING THE SAME

(75) Inventors: Kazutaka Takahashi, Shizuoka (JP); Katsuyuki Watanabe, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 196 days.

(21) Appl. No.: 11/376,218

(22) Filed: Mar. 16, 2006

(65) Prior Publication Data

US 2006/0207475 A1   Sep. 21, 2006

(30) Foreign Application Priority Data

Mar. 17, 2005   (JP) .......................... P.2005-077104

(51) Int. Cl.
*C09D 4/00* (2006.01)
*C09D 7/00* (2006.01)
*C04B 41/49* (2006.01)
*C04B 41/50* (2006.01)
*C09J 11/06* (2006.01)
*C07F 7/18* (2006.01)

(52) U.S. Cl. ............... 106/285; 106/287.1; 106/287.13; 106/287.14; 106/287.28; 106/287.35

(58) Field of Classification Search ............... 106/287.1
See application file for complete search history.

(56) References Cited

U.S. PATENT DOCUMENTS

| 6,509,415 | B1 | 1/2003 | Lau et al. | |
|---|---|---|---|---|
| 6,962,727 | B2 * | 11/2005 | Bedwell et al. | 427/255.18 |
| 2003/0031789 | A1 * | 2/2003 | Bedwell et al. | 427/248.1 |
| 2003/0102285 | A1 * | 6/2003 | Nozaki et al. | 216/41 |
| 2003/0105264 | A1 * | 6/2003 | Bedwell et al. | 528/31 |
| 2003/0114598 | A1 * | 6/2003 | Li et al. | 525/275 |
| 2003/0130423 | A1 * | 7/2003 | Apen et al. | 525/100 |
| 2003/0151031 | A1 * | 8/2003 | Li et al. | 252/570 |
| 2003/0157801 | A1 * | 8/2003 | Kozawa et al. | 438/689 |
| 2004/0002573 | A1 * | 1/2004 | Apen et al. | 525/100 |
| 2004/0046155 | A1 * | 3/2004 | Li et al. | 252/570 |
| 2005/0171277 | A1 * | 8/2005 | Li et al. | 524/588 |
| 2005/0267308 | A1 * | 12/2005 | Morita et al. | 556/465 |

* cited by examiner

*Primary Examiner*—Randy Gulakowski
*Assistant Examiner*—Robert Loewe
(74) *Attorney, Agent, or Firm*—Sughrue Mion, PLLC

(57) ABSTRACT

A film-forming composition comprising: a compound having a cage structure; and a silicon-containing surfactant; an insulating film formed by using the composition; and further, an electronic device comprising the insulating film.

9 Claims, No Drawings

FILM-FORMING COMPOSITION, INSULATING FILM OBTAINED FROM THE COMPOSITION AND ELECTRONIC DEVICE HAVING THE SAME

BACKGROUND OF THE INVENTION

1. Field of the Invention

The present invention relates to a film-forming composition, and more precisely, to a composition for forming an insulating film having good film properties such as a good dielectric constant, a good mechanical strength and a good CMP resistance. It further relates to an electronic device having the insulating film obtained by using the composition.

2. Description of the Related Art

In recent years, accompanied by the progress of high integration, multifunction and high performance in the field of electronic materials, circuit resistance and condenser capacity between wirings have been increased thus causing increase of electric power consumption and delay time. Particularly, increase of delay time becomes a large factor for the reduction of signal speed of devices and generation of crosstalk, so that reduction of parasitic resistance and parasitic capacity are in demand for the purpose of attaining acceleration of devices by reducing this delay time. As one of the concrete measures for reducing this parasitic capacity, an attempt has been made to cover periphery of wiring with a low dielectric layer insulating film. Also, the layer insulating film is expected to have superior heat resistance which can withstand the thin film formation step at the time of mounting substrate production and chip connection, pin attachment and the like post steps and also chemical resistance that can withstand wet process. In addition, a low resistance Cu wiring has been introduced in recent years instead of the Al wiring, and accompanied by this, flattening by CMP (chemical mechanical polishing) is commonly carried out, so that high mechanical strength which can withstand this process is in demand.

Polybenzoxazole and polyimide are widely known for insulating films of good heat resistance. However, since they contain a nitrogen atom of high polarity, they could not form films that are satisfactory in point of the necessary low level of dielectric constant, the water absorption resistance, the durability and the hydrolysis resistance.

In general, many organic polymers are poorly soluble in organic solvent, and a technique of preventing polymer deposition in coating solutions and preventing depositions in insulating films is an important theme in the art. To solve the problems, when the polymers are so modified that their main chain has a folded structure in order to have an increased solubility, then their glass transition point lowers and their heat resistance also lowers, and, after all, it is not easy to obtain polymers that satisfy both the intended properties and the solubility.

Also, there has been known a highly heat-resistant resin having a backbone structure (main chain) of polyarylene ether (U.S. Pat. No. 6,509,415) which has a dielectric constant in the range of from 2.6 to 2.7. However, it is desired to further lower the dielectric constant of the resin for realizing high-speed devices. It is also desired not to make a film porous but to make the film have a bulk specific dielectric constant of 2.6 or less, more preferably 2.5 or less.

SUMMARY OF THE INVENTION

The present invention relates to a film-forming composition for solving the above-mentioned problems, and more particularly, to a composition for forming a film having good film properties such as a good dielectric constant, a good mechanical strength and a good CMP resistance, and further, to an insulating film (also referred to as a "dielectric film" and a "dielectric insulating film", and these terms are not substantially distinguished) obtained by using the composition and an electronic device having the insulating film.

The present inventors have found that the above-mentioned problems can be solved by the constitutions (1) to (12) mentioned below.

(1) A film-forming composition comprising:
a compound having a cage structure; and
a silicon-containing surfactant.

(2) The film-forming composition as described in (1) above, wherein the cage structure is a saturated hydrocarbon structure.

(3) The film-forming composition as described in (1) or (2) above, wherein a ratio of all carbon atoms of the cage structure to all carbon atoms of a total solid content of the film-forming composition is 30% or more.

(4) The film-forming composition as described in any of (1) to (3) above, wherein the cage structure is a diamantane structure.

(5) The film-forming composition as described in (4) above, wherein the compound having a cage structure is a polymer of at least one compound represented by formula (I):

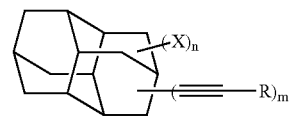

Formula (I)

wherein R represents a hydrogen atom, an alkyl group, an alkenyl group, an alkynyl group, an aryl group or a silyl group;

m represents an integer of from 1 to 14;

X represents a halogen atom, an alkyl group, an alkenyl group, an aryl group or a silyl group; and n represents an integer of from 0 to 13.

(6) The film-forming composition as described in any of (1) to (5) above, wherein the compound having a cage structure is a compound that does not contain a nitrogen atom.

(7) The film-forming composition as described in any of (1) to (6) above, wherein an amount of the silicon-containing surfactant is from 0.01 to 1% by weight based on a total weight of the film-forming composition.

(8) The film-forming composition as described in any of (1) to (7) above, wherein an amount of the silicon-containing surfactant is from 0.1 to 0.5% by weight based on a total weight of the film-forming composition.

(9) The film-forming composition as described in any of (1) to (8) above, wherein the silicon-containing surfactant contains an alkylene oxide structure and a dimethylsiloxane structure.

(10) The film-forming composition as described in any of (1) to (9) above, which further comprises an organic solvent.

(11) An insulating film formed by utilizing a film-forming composition as described in any of (1) to (10) above.

(12) An electronic device comprising an insulating film as described in (11) above.

DETAILED DESCRIPTION OF THE INVENTION

The invention will be described in detail below.

<Compound having a cage structure>

The "cage structure" as referred to herein is meant to indicate a molecule in which the plural rings formed of covalent-bonded atoms define the capacity of the structure and in which all points existing inside the capacity could not leave the capacity without passing through the rings. For example, an adamantane structure may be considered as the cage structure. Contrary to this, a single crosslink-having cyclic structure such as norbornane (bicyclo[2,2,1]heptane) could not be considered as the cage structure since the ring of the single-crosslinked cyclic compound does not define the capacity of the compound.

The number of all carbon atoms of the cage structure in the invention is preferably from 10 to 30, more preferably from 10 to 18, particularly preferably 14.

The carbon atoms that constitute the cage structure do not include the carbon atoms of the linking group and the substituent bonding to the cage structure. For example, 1-methyladamantane is constituted by 10 carbon atoms, and 1-ethyldiamantane is constituted by 14 carbon atoms.

Preferably, the compound of the invention having a cage structure is a saturated hydrocarbon. Preferred examples thereof are diamond-like adamantanes, diamantanes, triamantanes, tetramantanes and dodecahedranes as having good heat resistance. Of those, adamantine, diamantanes and triamantanes are preferred; and diamantanes are particularly preferred as having a low dielectric resistance and easy to synthesize.

The cage structure in the invention may have one or more substituents, and examples of the substituent include a halogen atom (a fluorine atom, a chlorine atom, a bromine atom or an iodine atom), a straight-chained, branched or cyclic alkyl group containing from 1 to 10 carbon atoms (e.g., methyl, t-butyl, cyclopentyl or cyclohexyl), an alkenyl group containing from 2 to 10 carbon atoms (e.g., vinyl or propenyl), an alkynyl group containing from 2 to 10 carbon atoms (e.lg., ethynyl or phenylethynyl), an aryl group containing from 6 to 20 carbon atoms (e.g., phenyl, 1-naphthyl or 2-naphthyl), an acyl group containing from 2 to 10 carbon atoms (e.g., benzoyl), an aryloxy group containing from 6 to 20 carbon atoms (e.g., phenoxy), an arylsulfonyl group containing from 6 to 20 carbon atoms (e.g., phenylsulofonyl), a nitro group, a cyano group, and a silyl group (e.e.g, triethoxysilyl, methyldiethoxysilyl or trivinylsilyl). Of these, a fluorine atom, a bromine atom, a straight-chained, branched or cyclic alkyl group containing from 1 to 5 carbon atoms, an alkenyl group containing from 2 to 5 carbon atoms, an alkynyl group containing from 2 to 5 carbon atoms and a silyl group are preferred substituents. These substituents may further be substituted by other substituent.

Preferably, the cage structure in the invention has one to four substituent(s), more preferably two or three substituents, still more preferably two substituents. The substituent bonding to the cage structure may be a mono- or more poly-valent substituent or a di- or more poly-valent linking group.

The "compound having a cage structure" in accordance with the invention may be either a low molecular weight compound or a high molecular weight compound (e.g., a polymer), but preferred is a polymer. When the compound having a cage structure is a polymer, its weight average molecular weight is preferably from 1,000 to 500,000, more preferably from 5,000 to 300,000, particularly preferably from 10,000 to 200,000. The polymer having a cage structure may be contained in a film-forming composition as a resin composition having a molecular weight distribution. When the compound having a cage structure is a low molecular weight compound, its molecular weight is preferably 3,000 or less, more preferably 2,000 or less, particularly preferably 1,000 or less.

The cage structure in the invention may be incorporated into a polymer principal chain as a monovalent pendant group. As a desirable polymer principal chain to which a cage structure is bonded, there are illustrated conjugated linking chains such as poly(arylene), poly(arylene ether), poly(ether) and polyacetylene, and polyethylene. Of these, poly(arylene ether) and polyacetylene are particularly desirable with respect to a good heat resistance.

It is particularly desirable that the cage structure of the invention forms a part of a polymer principal chain when the compound having a cage structure is a polymer. That is, when it forms a part of a polymer principal chain, it means that polymer chain is cut off when the cage compound is removed from this polymer. In this embodiment, the cage structure is directly single-bonded or connected by an appropriate divalent connecting group. Examples of the connecting group include —C($R^{11}$)($R^{12}$)—, —C($R^{13}$)=C($R^{14}$)—, —C≡C—, arylene group, —CO—, —O—, —SO$_2$—, —N($R^{15}$)—, —Si($R^{16}$)($R^{17}$)— and a group as a combination thereof. In this case, $R^{11}$ to $R^{17}$ each independently represents a hydrogen atom, an alkyl group, an alkenyl group, an alkynyl group, an aryl group or an alkoxy group. These connecting groups may be substituted with a substituting group, and for example, the aforementioned substituting groups can be cited as preferred examples.

More preferred connecting groups among them is —C($R^{11}$)($R^{12}$)—, —CH=CH—, —C≡C—, an arylene group, —O—, —Si($R^{16}$)($R^{17}$)— or a group as a combination thereof, and particularly preferred is —CH=CH—, —C≡C—, —O—, —Si($R^{16}$)($R^{17}$)— or a group as a combination thereof.

The "compound having a cage structure" in accordance with the invention may contain one or two or more species of the cage structures in the molecule of the compound.

Specific examples of the "compound having a cage structure" are shown below, to which, however, the invention is not limited.

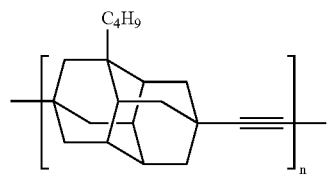 (A-1)
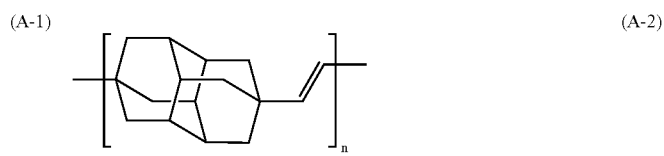 (A-2)
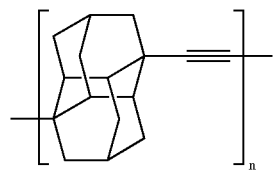 (A-3)
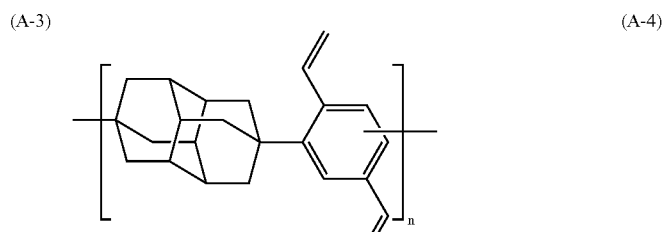 (A-4)
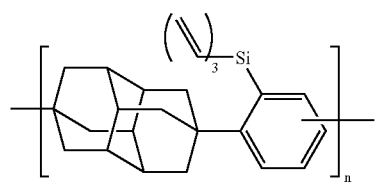 (A-5)
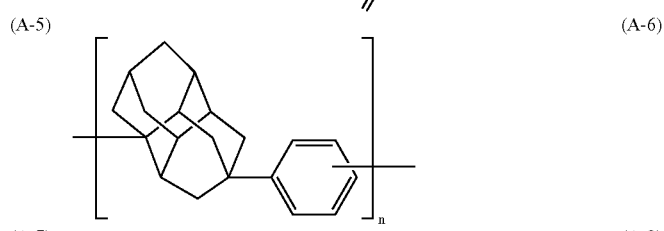 (A-6)
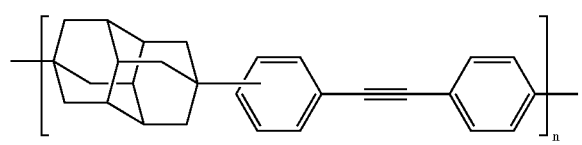 (A-7)
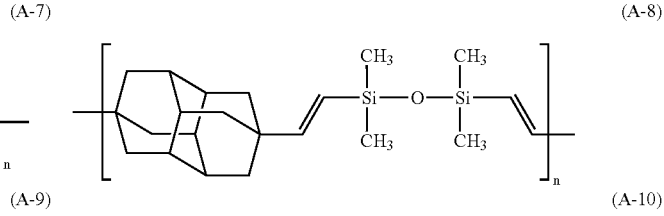 (A-8)
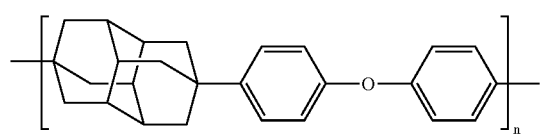 (A-9)
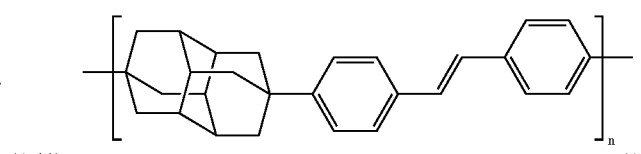 (A-10)
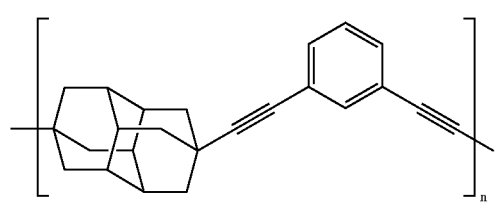 (A-11)
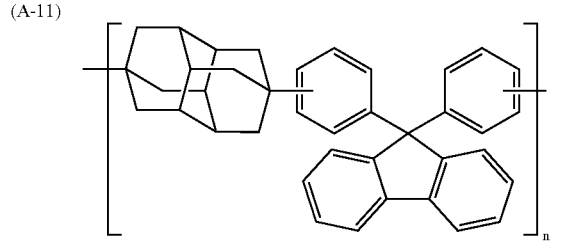 (A-12)
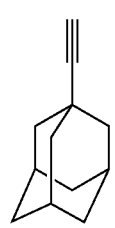 (A-13)
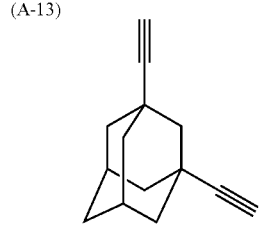 (A-14)
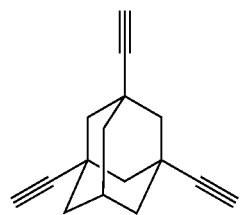 (A-15)
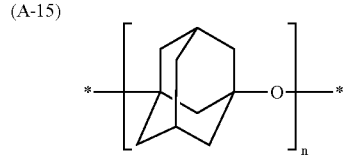 (A-16)
 (A-17)

Especially preferably, the compound having a cage structure is a polymer of a compound of the following formula (I):

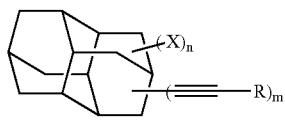

Formula (I)

In the formula (I),

R represents a hydrogen atom, an alkyl group (containing preferably from 1 to 10 carbon atoms), an alkenyl group (containing preferably from 2 to 10 carbon atoms), an alkynyl group (containing preferably from 2 to 10 carbon atoms), an aryl group (containing preferably from 6 to 20 carbon atoms) or a silyl group (containing preferably from 0 to 20 carbon atoms.

When R represents a group other than a hydrogen atom, R may further be substituted by other substituent. Examples of such substituent include a halogen atom (a fluorine atom, a chlorine atom, a bromine atom or an iodine atom), an alkyl group, an alkenyl group, an alkynyl group, an aryl group, an acyl group, an aryloxy group, an arylsulfonyl group, a nitro group, a cyano group and a silyl group.

R preferably represents a hydrogen atom, an alkyl group containing from 1 to 10 carbon atoms, an aryl group containing from 6 to 20 carbon atoms or a silyl group containing from 0 to 20 carbon atoms, more preferably represents a hydrogen atom or a silyl group containing from 0 to 10 carbon atoms.

m represents an integer of from 1 to 14, preferably from 1 to 4, more preferably from 1 to 3, particularly preferably 2 or 3.

X represents a halogen atom, an alkyl group (containing preferably from 1 to 10 carbon atoms), an alkenyl group (containing preferably from 2 to 10 carbon atoms), an aryl group (containing preferably from 6 to 20 carbon atoms) or a silyl group (containing preferably from 0 to 20 carbon atoms).

X may further be substituted by other substituent. As examples of such substituent, there may be illustrated the same ones as have been illustrated hereinbefore. X preferably represents a fluorine atom, a chlorine atom, a bromine atom, an alkyl group containing from 1 to 10 carbon atoms, an alkenyl group containing from 2 to 10 carbon atoms or a silyl group containing from 0 to 20 carbon atoms, with a bromine atom, an alkenyl group containing from 2 to 4 carbon atoms or a silyl group containing from 0 to 10 carbon atoms being more preferred.

n represents an integer of from 0 to 13, preferably from 0 to 3, more preferably from 0 to 2, particularly preferably 0 or 1.

Polymerization of the compound represented by formula (I) is optimally conducted in an organic solvent at an inside temperature of preferably from 0C. to 220° C., more preferably from 50° C. to 210° C., particularly preferably from 100° C. to 200° C. for a period of from 1 to 50 hours, more preferably from 2 to 20 hours, particularly preferably from 3 to 10 hours. A metal catalyst such as palladium, nickel, tungsten or molybdenum may be used as needed.

The weight-average molecular weight of the polymer obtained by the polymerization is in the range of preferably from 1,000 to 500,000, more preferably from 5,000 to 300,000, particularly preferably from 10,000 to 200,000.

Specific examples of the compound represented by formula (I) are shown below.

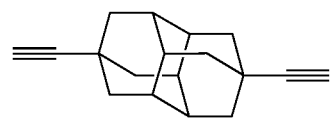
(D-1)

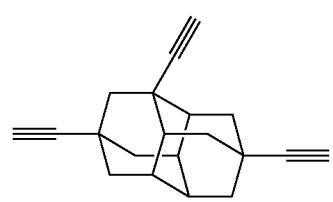
(D-2)

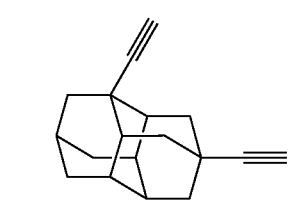
(D-3)

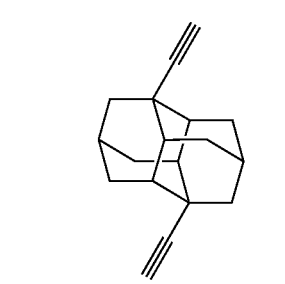
(D-4)

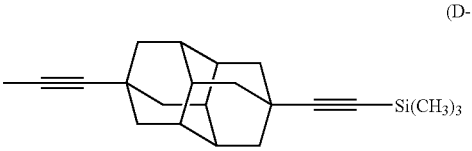
(D-5)

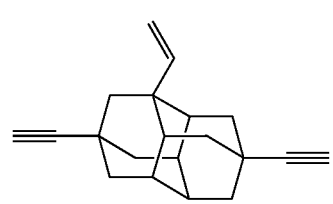
(D-6)

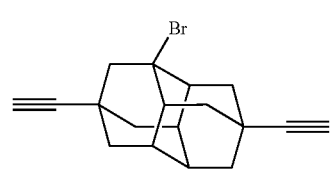
(D-7)

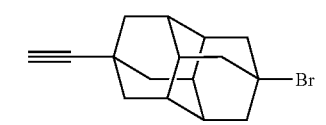
(D-8)

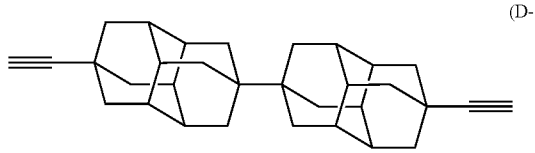
(D-9)

-continued

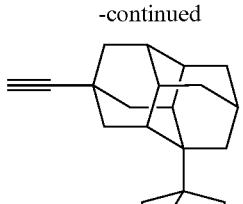
(D-10)

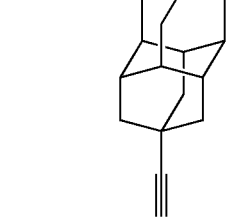
(D-11)

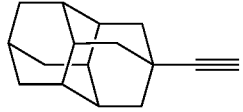
(D-12)

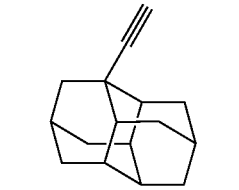
(D-13)

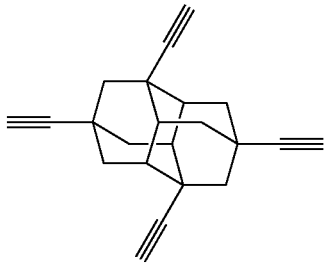
(D-14)

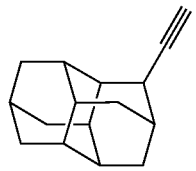
(D-15)

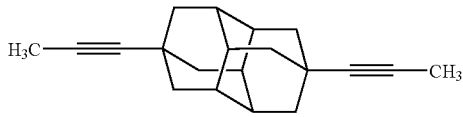
(D-16)

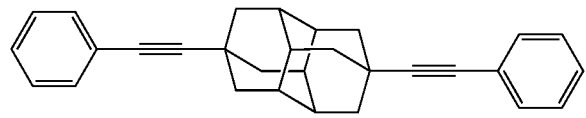

The compound of the invention having a cage structure preferably has a reactive group capable of forming a covalent bond with other molecule upon being heated. Such reactive group is not particularly limited but, for example, those substituents which cause a cyclization addition reaction or radical polymerization reaction can preferably be utilized. For example, a group having a double bond (e.g., a vinyl group or an allyl group), a group having a triple bond (e.g., an ethynyl group or a phenylethynyl group) and a combination of a diene group and a dienophile group for causing Diels-Alder reaction are effective, with an ethynyl group and a phenylethynyl group being particularly effective.

Also, the compound of the invention having a cage structure preferably does not contain nitrogen atom which can enhance molar polarization ratio or hygroscopic properties, because the nitrogen atom functions to enhance dielectric constant. Particularly, polyimide compounds fail to provide a sufficiently low dielectric constant, and hence the compound of the invention having a cage structure is preferably a compound other than polyimide, i.e., a compound which does not have polyimide bond and amide bond.

In view of imparting good properties (dielectric constant and mechanical strength) to the insulating film formed from the composition of the invention, the ratio of all carbon atoms of the cage structure to all carbon atoms of the total solid content of the film-forming composition is preferably 30% or more, more preferably from 50 to 95%, still more preferably from 60% to 90%. Here, the total solid content of the film-forming composition corresponds to the total solid content constituting the insulating film obtained from this film-forming composition. Additionally, those which will not remain after formation of the insulating film such as a blowing agent are not included in the solid content.

In the invention, the "silicon-containing surfactant" is a surfactant containing at least one Si atom, and may be any silicon-containing surfactant. The "silicon-containing surfactant" is preferably a "silicone-containing surfactant".

Preferred examples of the silicon-containing surfactant include silicone-containing surfactants having a structure containing alkylene oxide and dimethylsiloxane. The contents of alkylene oxide and dimethylsiloxane are usually in the range of from 15 to 85% by weight.

In particular, silicone-containing surfactants having the following structure (A) are preferred, and silicone-containing surfactants containing the following structure (A) in a content of from 30 to 100% by weight are more preferred.

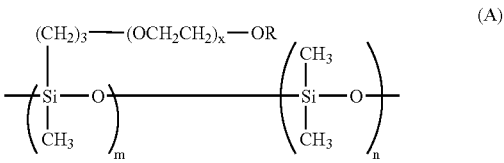
(A)

In the above formula, R represents a hydrogen atom or an alkyl group (containing preferably from 1 to 5 carbon atoms), x represents an integer of from 1 to 20, and m and n each independently represents an integer of from 2 to 100.

As commercially available surfactants having the structure (A), there are illustrated those which are used in Examples.

Examples of commercially available silicon-containing surfactants to be used in the invention include BYK306 and BYK 307 (manufactured by BYK Chemie Co.), SH7PA, SH21PA, SH28PA and SH30PA (manufactured Toray Dow Corning Silicone Co.) and Troysol S366 (manufactured by Troy Chemical Industries Inc.).

The silicon-containing surfactants to be used in the invention may be used independently or as a combination of two or more thereof. It is also possible to use the silicon-containing surfactant together with other surfactant than that. Examples of the surfactants to be used together with the silicon-containing surfactant include nonionic surfactants other than the silicon-containing surfactants, anionic surfactants, cationic surfactants, amphoteric surfactants, polyalkyleneoxide series surfactants and fluorine-containing surfactants.

The addition amount of the silicon-containing surfactant to be used in the invention is preferably from 0.01 to 1% by weight, more preferably from 0.1 to 0.5% by weight, based on the total weight of the film-forming composition.

The film-forming composition of the invention may contain an organic solvent to use as a coating solution.

Suitable solvents which can be used in the invention are not particularly limited, and examples thereof include alcohol series solvents such as methanol, ethanol, isopropanol, 1-butanol, 2-ethoxymethanol and 3-methoxypropanol; ketone series solvents such as acetone, acetylacetone, methyl ethyl ketone, methyl isobutyl ketone, 2-pentanone, 3-pentanone, 2-heptanone, 3-heptanone and cyclohexanone; ester series solvents such as ethyl acetate, propyl acetate, butyl acetate, isobutyl acetate, pentyl acetate, ethyl propionate, propyl propionate, butyl propionate, isobutyl propionate, propylene glycol monomethyl ether acetate, methyl lactate, ethyl lactate and γ-butyrolactone; ether series solvents such as diisopropyl ether, dibutyl ether, ethyl propyl ether, anisole, phenetole and veratrol; aromatic hydrocarbon series solvents such as mesitylene, ethylbenzene, diethylbenzene, propylbenzene and 1,2-dichlorobenzene; and amide series solvents such as N-methylpyrrolidinone and dimethylacetamide. These may be used independently or in combination of two or more thereof.

More preferred solvents are acetone, propanol, cyclohexanone, propylene glycol monomethyl ether acetate, methyl lactate, ethyl lactate, γ-butyrolactone, anisole, mesitylene and 1,2-dichlorobenzene.

The concentration of the solid content of the coating solution to be used in the invention is preferably from 3 to 50% by weight, more preferably from 5 to 35% by weight, particularly preferably from 7 to 20% by weight.

Further, to the film-forming composition of the invention may be added additives such as a radical generating agent, a nonionic surfactant, a fluorine-containing nonionic surfactant and a silane coupling agent within a range of not spoiling various properties (heat resistance, dielectric constant, mechanical strength, coating properties and adhesion properties) of the insulating film.

Examples of the radical generating agent include t-butyl peroxide, pentyl peroxide, hexyl peroxide, lauroyl peroxide, benzoyl peroxide, and azobisisobutyronitrile. Examples of the nonionic surfactant include octyl polyethylene oxide, decyl polyethylene oxide, dodecyl polyethylene oxide, octyl polypropylene oxide, decyl polypropylene oxide and dodecyl polypropylene oxide. Examples of the fluorine-containing nonionic surfactant include perfluorooctyl polyethylene oxide, perfluorodecyl polyethylene oxide and perfluorododecyl polyethylene oxide. Examples of the silane coupling agent include vinyltrimethoxysilane, vinyltriethoxysilane, vinyltriacetoxysilane, allyltrimethoxysilane, divinyldiethoxysilane, trivinylethoxysilane, and hydrolyzates and dehydration condensates thereof.

As to the addition amount of the additive, there exists a suitable range depending upon the use of the additive or the concentration of the solid content of the coating solution, but the addition amount is preferably from 0.001% to 10% by weight, more preferably from 0.01% to 5% by weight, particularly preferably from 0.05% to 2% by weight, based on the weight of the coating solution.

The insulating film can be formed by coating the coating solution of the invention on a substrate according to an arbitrary coating method such as a spin coating method, a roller coating method, a dip coating method or a scan coating method, then subjecting the coated substrate to a step of removing the solvent by heat treatment. The heat-treating method is referred to as a heat-drying step, and the latter step is not particularly limited, and a generally employed hot plate heating, a method of heating using a furnace or a method of irradiating with light using a xenon lamp in RTP (Rapid Thermal Processor) can be employed.

The insulating film obtained by using the film-forming composition of the invention is suitable for insulation-coating film in electronic parts such as semiconductor devices, multichip module multilayered wiring boards, etc. Specifically, it is usable as interlayer insulating film for semiconductors, surface protective film, buffer coat film, as well as for passivation film in LSI, α-ray blocking film, cover lay film in flexographic plates, overcoat film, cover coat for flexible copper-lined plates, solder-resist film, and liquid-crystal alignment film, etc.

The thickness of the coated film is not particularly limited, but is preferably from 0.001 to 100 μm, more preferably from 0.01 to 10 mμ, particularly preferably from 0.1 to 1 μm.

It is also possible to form a porous film by previously adding a blowing agent to the film-forming composition of the invention. The blowing agent to be previously added for forming the porous film is not particularly limited, and examples thereof include organic compounds having a boiling point higher than that of the solvent of the film-forming composition, thermally decomposable low molecular compounds and thermally decomposable high molecular compounds.

As to the addition amount of the blowing agent, there exists a suitable range depending upon the concentration of the solid content of the film-forming composition but, in general, the addition amount is preferably from 0.01 to 20%, more preferably from 0.1% to 10%, particularly preferably from 0.5 to 5%, in terms of % by weight in the film-forming composition.

The compound of the invention is preferably cross-linked by heating after coating it to form an insulating film excellent in mechanical strength and heat resistance. As to the optimal conditions for the heat treatment, heating temperature is preferably from 200 to 450° C., more preferably from 300 to 420° C., particularly preferably from 350 to 400° C., and the heating time is preferably from 1 minute to 2 hours, more preferably from 10 minutes to 1.5 hours, particularly preferably from 30 minutes to 1 hour. The heat treatment may be conducted in several steps.

EXAMPLES

The following Examples are to describe the invention but not to restrict the scope of the invention.

Structures of compounds used in Examples and Comparative Examples are shown below.

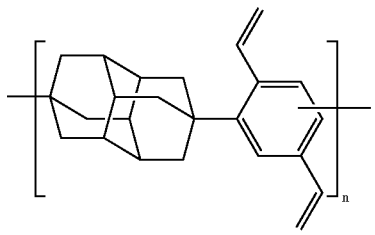

(A-4)

-continued

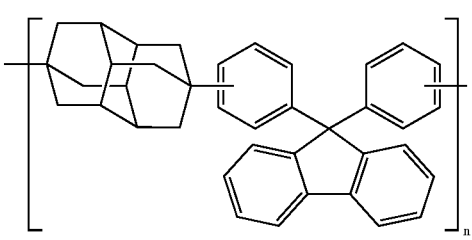
(A-12)

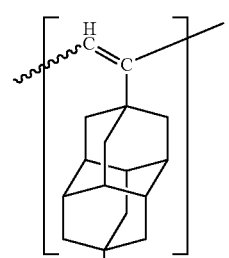
(A)

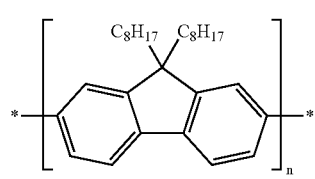
(B)

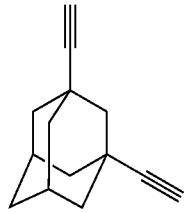
(A-14)

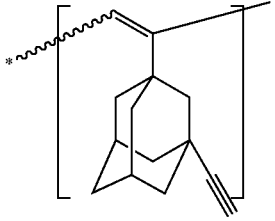
(A-21)

Synthesis Example 1

According to the method described in Macromolecules, 24, 5266 (1991), 4,9-dibromodiamantane was synthesized. Next, 1.30 g of commercially available p-divinylbenzene, 3.46 g of 4,9-dibromodiamantane, 200 ml of dichloroethane and 2.66 g of aluminum chloride were fed into a 500-ml flask, and stirred at an internal temperature of 70° C for 24 hours. Thereafter, 200 ml of water was added to it, and the organic layer was separated through liquid-liquid separation. Anhydrous sodium sulfate was added thereto, and the solid content was removed through filtration. Then, this was concentrated under reduced pressure until dichloromethane was reduced to a half. 300 ml of methanol was added to the resulting solution, and the deposited solid was taken out through filtration. 2.8 g of a polymer (A-4) having a weight-average molecular weight of about 10,000 was thus obtained.

In the same manner, a polymer (A-12) having a weight-average molecular weight of about 10,000 was synthesized through Friedel-Crafts reaction.

Synthesis Example 2

According to the method described in Macromolecules, 24, 5266 (1991), 4,9-diethynyldiamantane was synthesized using diamantane as a starting material. Next, 10 g of 4,9-diethynyldiamantane, 50 ml of 1,3, 5-triisopropylbenzene and 120 mg of Pd(PPh$_3$)$_4$ were stirred at an internal temperature of 190° C. for 12 hours in a nitrogen stream. After cooling the reaction solution to room temperature, 300 ml of isopropyl alcohol was added thereto. Solids thus precipitated were collected by filtration and then washed with methanol. Thus, there was obtained 3.0 g of a polymer (A) having a weight-average molecular weight of 20,000 was thus obtained.

Synthesis Example 3

10 g of compound (A-14), 50 ml of 1,3,5-triisopropylbenzene and 120 mg of Pd(PPh3)4 were stirred for 12 hours at an inner temperature of 190° C. in a nitrogen stream. After cooling the reaction solution to room temperature, 300 ml of isopropyl alcohol was added thereto. Solids thus precipitated were collected by filtration and then washed with methanol. Thus, there was obtained 4.2 g of a polymer (A-21) having a weight-average molecular weight of 16,000 was thus obtained.

Example 1

1.0 g of the above polymer (A-4) was dissolved in a mixed solvent of 5.0 ml of cyclohexanone and 5.0 ml of anisole under heating, followed by adding thereto a silicon-containing surfactant BYK306 manufactured by BYK Chemie Co. in an amount of 0.1% by weight to prepare a coating solution. The solution was filtered through a 0.1μ tetrafluoroethylene filter, and then applied onto a silicon wafer in a mode of spin coating. The coated film was heated on a hot plate in a nitrogen stream atmosphere at 180° C. for 60 seconds, then on a 400° C. hot plate for 30 minutes. The specific dielectric constant of the thus-formed insulating film having a thickness of 0.5 μ was calculated from the capacitance value thereof measured at 1 MHz by the use of Four Dimensions' mercury probe and Yokogawa Hewlett Packard's HP4285ALCR meter, and it was 2.49. The Young's modulus of the film was measured by using MTS' nano-indenter SA2, and was found to be 7.1 GPa. When a Cu blanket film prepared by using this coated film was subjected to CMP under a pressing pressure of 3.0 KPa using SPP600S manufactured by OKAMOTO KOSAKUKIKAI SEISAKUSHO and IC1400 manufactured by RODEL, there arose no film delamination.

Example 2

1.0 g of the above polymer (A-12) was dissolved under heat in a mixed solvent of 5.0 ml of gamma-butyrolactone and 5.0 ml of anisole, followed by adding thereto a silicon-containing surfactant BYK306 manufactured by BYK Chemie Co. in an amount of 0.1% by weight to prepare a coating solution. The solution was filtered through a 0.1-μ tetrafluoroethylene filter, and then applied onto a silicon wafer in a mode of spin coating. The coated film was heated on a hot plate in a nitrogen stream atmosphere at 180° C. for 60 seconds, then on a 300° C. hot plate for 10 minutes. The specific dielectric constant of the thus-formed insulating film having a thickness of 0.5 micron was 2.57. The Young's modulus of the film was 6.0 GPa. When a Cu blanket film prepared by using this coated film was subjected to CMP under a pressing pressure of 3.0 KPa using SPP600S manufactured by OKAMOTO KOSAKUKIKAI SEISAKUSHO and IC1400 manufactured by RODEL, there arose no film delamination.

Example 3

1.0 g of the polymer (A) synthesized in Synthesis Example 2 was dissolved in 10.0 ml of cyclohexanone, followed by adding thereto a silicon-containing surfactant BYK306 manufactured by BYK Chemie Co. in an amount of 0.1% by weight to prepare a coating solution. The solution was filtered through a 0.2-µ tetrafluoroethylene filter, and then applied onto a silicon wafer in a mode of spin coating. The coated film was heated on a hot plate in a nitrogen stream atmosphere at 110° C. for 90 seconds, then at 250° C. for 60 seconds, followed by further heating in a nitrogen-purged 400° C. oven for 60 minutes. The specific dielectric constant of the thus-formed insulating film having a thickness of 0.50 micron was 2.42. The Young's modulus of the film was 7.1 GPa. When a Cu blanket film prepared by using this coated film was subjected to CMP under a pressing pressure of 3.0 KPa using SPP600S manufactured by OKAMOTO KOSAKUKIKAI SEISAKUSHO and IC1400 manufactured by RODEL, there arose no film delamination.

Example 4

1.0 g of the polymer (A) synthesized in Synthesis Example 2 was dissolved in 10.0 ml of cyclohexanone, followed by adding thereto a silicon-containing surfactant SH28PA manufactured by Toray Dow Corning Silicone Co. in an amount of 0.1% by weight to prepare a coating solution. The solution was filtered through a 0.2-µ tetrafluoroethylene filter, and then applied onto a silicon wafer in a mode of spin coating. The coated film was heated on a hot plate in a nitrogen stream atmosphere at 110° C. for 90 seconds, then at 250° C. for 60 seconds, followed by further heating in a nitrogen-purged 400° C. oven for 60 minutes. The specific dielectric constant of the thus-formed insulating film having a thickness of 0.50 micron was 2.42. The Young's modulus of the film was 7.1 GPa. When a Cu blanket film prepared by using this coated film was subjected to CMP under a pressing pressure of 3.0 KPa using SPP600S manufactured by OKAMOTO KOSAKUKIKAI SEISAKUSHO and IC1400 manufactured by RODEL, there arose no film delamination.

Example 5

1.0 g of the polymer (A) synthesized in Synthesis Example 2 was dissolved in 10.0 ml of cyclohexanone, followed by adding thereto a silicon-containing surfactant Troysol S366 manufactured by Troy Chemical Co. in an amount of 0.1% by weight to prepare a coating solution. The solution was filtered through a 0.2-µ tetrafluoroethylene filter, and then applied onto a silicon wafer in a mode of spin coating. The coated film was heated on a hot plate in a nitrogen stream atmosphere at 110° C. for 90 seconds, then at 250° C. for 60 seconds, followed by further heating in a nitrogen-purged 400° C. oven for 60 minutes. The specific dielectric constant of the thus-formed insulating film having a thickness of 0.50 micron was 2.42. The Young's modulus of the film was 7.1 GPa. When a Cu blanket film prepared by using this coated film was subjected to CMP under a pressing pressure of 3.0 KPa using SPP600S manufactured by OKAMOTO KOSAKUKIKAI SEISAKUSHO and IC1400 manufactured by RODEL, there arose no film delamination.

Comparative Example 1

1.0 g of the polymer (A) synthesized in Synthesis Example 2 was dissolved in 10.0 ml of cyclohexanone, followed by adding thereto sodium perfluorododecylsulfonate in an amount of 0.1% by weight to prepare a coating solution. The solution was filtered through a 0.2-µ tetrafluoroethylene filter, and then applied onto a silicon wafer in a mode of spin coating. The coated film was heated on a hot plate in a nitrogen stream atmosphere at 110° C. for 90 seconds, then at 250° C. for 60 seconds, followed by further heating in a nitrogen-purged 400° C. oven for 60 minutes. The specific dielectric constant of the thus-formed insulating film having a thickness of 0.50 micron was 2.42. The Young's modulus of the film was 7.1 GPa. When a Cu blanket film prepared by using this coated film was subjected to CMP under a pressing pressure of 3.0 KPa using SPP600S manufactured by OKAMOTO KOSAKUKIKAI SEISAKUSHO and IC1400 manufactured by RODEL, there arose delamination partly in the edge portion thereof.

Comparative Example 2

1.0 g of the polymer (A) synthesized in Synthesis Example 2 was dissolved in 10.0 ml of cyclohexanone to prepare a coating solution. The solution was filtered through a 0.2-µ tetrafluoroethylene filter, and then applied onto a silicon wafer in a mode of spin coating. The coated film was heated on a hot plate in a nitrogen stream atmosphere at 110° C. for 90 seconds, then at 250° C. for 60 seconds, followed by further heating in a nitrogen-purged 400° C. oven for 60 minutes. The specific dielectric constant of the thus-formed insulating film having a thickness of 0.50 micron was 2.42. The Young's modulus of the film was 7.1 GPa. When a Cu blanket film prepared by using this coated film was subjected to CMP under a pressing pressure of 3.0 KPa using SPP600S manufactured by OKAMOTO KOSAKUKIKAI SEISAKUSHO and IC1400 manufactured by RODEL, there arose delamination partly in the edge portion thereof.

Example 6

1.0 g of the polymer (A-21) synthesized in Synthesis Example 3 was dissolved in 10.0 ml of cyclohexanone, followed by adding thereto a silicon-containing surfactant BYK306 manufactured by BYK Chemie Co. in an amount of 0.1% by weight to prepare a coating solution. The solution was filtered through a 0.2-µ tetrafluoroethylene filter, and then applied onto a silicon wafer in a mode of spin coating. The coated film was heated on a hot plate in a nitrogen stream atmosphere at 110° C. for 90 seconds, then at 250° C. for 60 seconds, followed by further heating in a nitrogen-purged 400° C. oven for 60 minutes. The specific dielectric constant of the thus-formed insulating film having a thickness of 0.50 micron was 2.70. The Young's modulus of the film was 6.4 GPa. When a Cu blanket film prepared by using this coated film was subjected to CMP under a pressing pressure of 3.0 KPa using SPP600S manufactured by OKAMOTO KOSAKUKIKAI SEISAKUSHO and IC1400 manufactured by RODEL, there arose no film delamination.

Comparative Example 3

1.0 g of the polymer (A-21) synthesized in Synthesis Example 3 was dissolved in 10.0 ml of cyclohexanone, followed by adding thereto sodium perfluorododecylsulfonate in an amount of 0.1% by weight to prepare a coating solution. The solution was filtered through a 0.2-μ tetrafluoroethylene filter, and then applied onto a silicon wafer in a mode of spin coating. The coated film was heated on a hot plate in a nitrogen stream atmosphere at 110° C. for 90 seconds, then at 250° C. for 60 seconds, followed by further heating in a nitrogen-purged 400° C. oven for 60 minutes. The specific dielectric constant of the thus-formed insulating film having a thickness of 0.50 micron was 2.70. The Young's modulus of the film was 6.4 GPa. When a Cu blanket film prepared by using this coated film was subjected to CMP under a pressing pressure of 3.0 KPa using SPP600S manufactured by OKAMOTO KOSAKUKIKAI SEISAKUSHO and IC1400 manufactured by RODEL, there arose delamination partly in the edge portion thereof.

Comparative Example 4

1.0 g of the polymer (A-21) synthesized in Synthesis Example 3 was dissolved in 10.0 ml of cyclohexanone to prepare a coating solution. The solution was filtered through a 0.2-μ tetrafluoroethylene filter, and then applied onto a silicon wafer in a mode of spin coating. The coated film was heated on a hot plate in a nitrogen stream atmosphere at 110° C. for 90 seconds, then at 250° C. for 60 seconds, followed by further heating in a nitrogen-purged 400° C. oven for 60 minutes. The specific dielectric constant of the thus-formed insulating film having a thickness of 0.50 micron was 2.70. The Young's modulus of the film was 6.4 GPa. When a Cu blanket film prepared by using this coated film was subjected to CMP under a pressing pressure of 3.0 KPa using SPP600S manufactured by OKAMOTO KOSAKUKIKAI SEISAKUSHO and IC1400 manufactured by RODEL, there arose delamination in the edge portion thereof.

Comparative Example 5

1.0 g of polymer (B) whose structure has been shown hereinbefore (obtained from SIGMA-ALDRICH) was dissolved in 10.0 ml of cyclohexanone to prepare a coating solution, followed by adding thereto a silicon-containing surfactant BYK306 manufactured by BYK Chemie Co. in an amount of 0.1% by weight. The solution was filtered through a 0.2-micron tetrafluoroethylene filter, and then applied onto a silicon wafer in a mode of spin coating. The coated film was heated on a hot plate in a nitrogen stream at 110° C. for 90 seconds and then at 200° C. for 60 seconds, followed by further heating in a nitrogen-purged 250° C. oven for 60 minutes. The specific dielectric constant of the thus-formed insulating film having a thickness of 0.50 micron was 2.70. The Young's modulus of the film was 3.5 GPa. When a Cu blanket film prepared by using this coated film was subjected to CMP under a pressing pressure of 3.0 KPa using SPP600S manufactured by OKAMOTO KOSAKUKIKAI SEISAKUSHO and IC1400 manufactured by RODEL, there arose delamination partly in the edge portion thereof.

Comparative Example 6

1.0 g of polymer (B) whose structure has been shown hereinbefore (obtained from SIGMA-ALDRICH) was dissolved in 10.0 ml of cyclohexanone to prepare a coating solution, followed by adding thereto sodium perfluorododecylsulfonate in an amount of 0.1% by weight. The solution was filtered through a 0.2-micron tetrafluoroethylene filter, and then applied onto a silicon wafer in a mode of spin coating. The coated film was heated on a hot plate in a nitrogen stream at 110° C. for 90 seconds and then at 200° C. for 60 seconds, followed by further heating in a nitrogen-purged 250° C. oven for 60 minutes. The specific dielectric constant of the thus-formed insulating film having a thickness of 0.50 micron was 2.70. The Young's modulus of the film was 3.5 GPa. When a Cu blanket film prepared by using this coated film was subjected to CMP under a pressing pressure of 3.0 KPa using SPP600S manufactured by OKAMOTO KOSAKUKIKAI SEISAKUSHO and IC1400 manufactured by RODEL, there arose delamination in the edge portion thereof.

Comparative Example 7

1.0 g of polymer (B) whose structure has been shown hereinbefore (obtained from SIGMA-ALDRICH) was dissolved in 10.0 ml of cyclohexanone to prepare a coating solution. The solution was filtered through a 0.2-micron tetrafluoroethylene filter, and then applied onto a silicon wafer in a mode of spin coating. The coated film was heated on a hot plate in a nitrogen stream at 110° C. for 90 seconds and then at 200° C. for 60 seconds, followed by further heating in a nitrogen-purged 250° C. oven for 60 minutes. The specific dielectric constant of the thus-formed insulating film having a thickness of 0.50 micron was 2.70. The Young's modulus of the film was 3.5 GPa. When a Cu blanket film prepared by using this coated film was subjected to CMP under a pressing pressure of 3.0 KPa using SPP600S manufactured by OKAMOTO KOSAKUKIKAI SEISAKUSHO and IC1400 manufactured by RODEL, there arose delamination in the edge portion thereof.

The above results show that the insulating films obtained from the film-forming composition of the invention do not cause film delamination upon CMP and have a lower dielectric constant and a higher Young's modulus in comparison with those obtained in Comparative Examples.

The insulating film obtained from the film-forming composition of the invention has good film properties such as dielectric constant and mechanical strength. Therefore, the film can be utilized as an interlayer insulating film in an electronic device.

The entire disclosure of each and every foreign patent application from which the benefit of foreign priority has been claimed in the present application is incorporated herein by reference, as if fully set forth.

What is claimed is:

1. An insulating film-forming composition comprising:
   a compound having a cage structure; and
   a silicon-containing surfactant;
   wherein the cage structure is a diamantane structure and the compound having a cage structure is a polymer of at least one compound represented by formula (I):

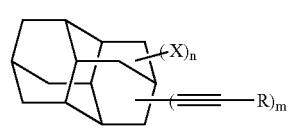

Formula (I)

wherein R represents a hydrogen atom, an alkyl group, an alkenyl group, an alkynyl group, an aryl group or a silyl group;

m represents an integer of from 1 to 14;

X represents a halogen atom, an alkyl group, an alkenyl group, an aryl group or a silyl group; and n represents an integer of from 0 to 13.

2. The insulating film-forming composition according to claim 1, wherein a ratio of all carbon atoms of the cage structure to all carbon atoms of a total solid content of the film-forming composition is 30% or more.

3. The insulating film-forming composition according to claim 1, wherein the compound having a cage structure is a compound that does not contain a nitrogen atom.

4. The insulating film-forming composition according to claim 1, wherein an amount of the silicon-containing surfactant is from 0.01 to 1% by weight based on a total weight of the film-forming composition.

5. The insulating film-forming composition according to claim 4, wherein an amount of the silicon-containing surfactant is from 0.1 to 0.5% by weight based on a total weight of the film-forming composition.

6. The insulating film-forming composition according to claim 1, wherein the silicon-containing surfactant contains an alkylene oxide structure and a dimethylsiloxane structure.

7. The insulating film-forming composition according to claim 1, which further comprises an organic solvent.

8. An electronic device comprising an insulating film according to claim 1.

9. An insulating film-forming composition comprising:

a compound having a cage structure; and a silicon-containing surfactant, wherein the cage structure is a diamantane structure; the diamantane structure is a polymer; and the diamantane structures are connected by at least one connecting group selected from the group consisting of —CH=CH—, —C≡C—, —O—, —Si($R^{16}$)($R^{17}$)— or a group as a combination thereof.

* * * * *